(12) United States Patent
Bauer et al.

(10) Patent No.: US 11,031,473 B2
(45) Date of Patent: Jun. 8, 2021

(54) SILICON CARBIDE SUPERJUNCTION POWER SEMICONDUCTOR DEVICE AND METHOD FOR MANUFACTURING THE SAME

(71) Applicant: ABB Power Grids Switzerland AG, Baden (CH)

(72) Inventors: Friedhelm Bauer, Semione (CH); Lars Knoll, Wohlenschwil (CH); Marco Bellini, Schlieren (CH); Renato Minamisawa, Windisch (CH); Umamaheswara Vemulapati, Wettingen (CH)

(73) Assignee: ABB POWER GRIDS SWITZERLAND AG, Baden (CH)

( * ) Notice: Subject to any disclaimer, the term of this patent is extended or adjusted under 35 U.S.C. 154(b) by 34 days.

(21) Appl. No.: 16/558,935

(22) Filed: Sep. 3, 2019

(65) Prior Publication Data
US 2020/0006496 A1  Jan. 2, 2020

Related U.S. Application Data

(63) Continuation of application No. PCT/EP2018/055224, filed on Mar. 2, 2018.

(30) Foreign Application Priority Data

Mar. 3, 2017  (EP) .................................... 17159033

(51) Int. Cl.
*H01L 29/16* (2006.01)
*H01L 29/06* (2006.01)
(Continued)

(52) U.S. Cl.
CPC ...... *H01L 29/1608* (2013.01); *H01L 29/0634* (2013.01); *H01L 29/66734* (2013.01); *H01L 29/7813* (2013.01)

(58) Field of Classification Search
CPC ............. H01L 29/1608; H01L 29/0634; H01L 29/66734; H01L 29/7813
(Continued)

(56) References Cited

U.S. PATENT DOCUMENTS 5,753,938 A * 5/1998 Thapar ................ H01L 29/7392
257/136
2002/0140025 A1 10/2002 Blanchard
(Continued)

FOREIGN PATENT DOCUMENTS

GB       2538768 A    11/2016
JP    2013232559 A    11/2013

OTHER PUBLICATIONS

European Patent Office, International Search Report & Written Opinion issued in corresponding Application No. PCT/EP2018/055224, dated Jun. 11, 2018, 12 pp.
(Continued)

*Primary Examiner* — Igwe U Anya
(74) *Attorney, Agent, or Firm* — Slater Matsil, LLP

(57) ABSTRACT

A power semiconductor device includes a semiconductor wafer having a first main side surface and a second main side surface. The semiconductor wafer includes a first semiconductor layer having a first conductivity type and a plurality of columnar or plate-shaped first semiconductor regions extending in the first semiconductor layer between the first main side surface and the second main side surface in a vertical direction perpendicular to the first main side surface and the second main side surface. The first semiconductor regions have a second conductivity type, which is different from the first conductivity type. Therein, the first semiconductor is a layer of hexagonal silicon carbide. The first semiconductor regions are regions of 3C polytype silicon carbide.

20 Claims, 10 Drawing Sheets

(51) Int. Cl.
*H01L 29/66* (2006.01)
*H01L 29/78* (2006.01)

(58) Field of Classification Search
USPC .......................................................... 257/77
See application file for complete search history.

(56) References Cited

U.S. PATENT DOCUMENTS

| | | |
|---|---|---|
| 2009/0159898 A1 | 6/2009 | Fujiwara et al. |
| 2010/0065857 A1* | 3/2010 | Harada ................. H01L 29/045 257/77 |
| 2016/0087032 A1 | 3/2016 | Hiyoshi |
| 2017/0345891 A1* | 11/2017 | Van Brunt .......... H01L 29/7802 |

OTHER PUBLICATIONS

Kosugi et al., "Development of SiC super-junction (SJ) device by deep trench-filling epitaxial growth," Materials Science Forum, Jan. 25, 2013, vols. 740-742, pp. 785-788.
Wijesundara et al., "Single-Source Chemical Vapor Deposition of 3C—SiC Films in a LPCVD Reactor," Journal of The Electrochemical Society, vol. 151, No. 3, 2004, pp. C210-C214.

* cited by examiner

SILICON CARBIDE SUPERJUNCTION POWER SEMICONDUCTOR DEVICE AND METHOD FOR MANUFACTURING THE SAME

FIELD OF THE INVENTION

The present invention relates to a silicon carbide (SiC) based superjunction (SJ) power semiconductor device, exemplarily to a SiC based vertical SJ power semiconductor device, and to a method for manufacturing the same.

BACKGROUND OF THE INVENTION

Power semiconductor devices are used as switches controlling the current flow through various electronic systems. They can be characterized by three main parameters that define among others the application range for such a power semiconductor device: the ON state resistance $R_{ON}$ which is the equivalent Ohmic resistance of the device in the ON state, the switching time which is needed to switch from the ON state to the OFF state and vice versa, and the breakdown voltage which is the maximum voltage that the device can sustain in the OFF state. In a vertical power semiconductor device a current is flowing in the ON state in a vertical direction from a first main side of a semiconductor wafer to a second main side of the semiconductor wafer whereas in the OFF state only a negligible current flows through the device. A thick and relatively lightly doped drift layer is used to increase the breakdown voltage by lowering the electric field in the space charge region of the blocking junction. However, on the other side employing the drift layer with a great thickness and light doping comes with worsening of the ON state resistance. The huge increase of the ON state resistance $R_{ON}$ with increasing breakdown voltage is a major limitation for power semiconductor devices. The superjunction (SJ) technique allows to shift the limit and decrease the ON state voltage for a given breakdown voltage. In silicon based power semiconductor devices SJ power semiconductor devices are in wide use for high power and high voltage applications. A SJ power semiconductor device includes a SJ drift layer structure characterized by alternating vertical p and n doped regions named n-type and p-type pillars.

Silicon carbide (SiC) offers a number of attractive characteristics for high voltage power semiconductors when compared to commonly used silicon (Si). Exemplarily, the much higher breakdown field strength and thermal conductivity of SiC allow creating devices which outperform by far the corresponding Si ones, and enable reaching otherwise unattainable efficiency levels. However, techniques used for fabricating SJ power semiconductor devices based on Si have proven to pose significant challenges when applying such techniques to fabrication of SiC based SJ power semiconductor devices. Especially the relatively low maximum depth achievable with ion implantation in SiC and the relatively low diffusion constants for dopants in SiC compared to Si result in difficulties when doping of deep regions is required as in the manufacture of SJ drift layer structures.

In the publication "First experimental demonstration of SiC super-junction (SJ) structure by multi-epitaxial growth method" by R. Kosugi et al., Proceedings of the 26th International Symposium on Power Semiconductor Devices & IC's, Jun. 15-19, 2014 Waikoloa, Hi., pages 346 to 349, it is described a method for manufacturing a 4H—SiC based SJ drift layer structure by multiple epitaxy and implantation steps. However, the method is inefficient with regard to time and costs especially for high voltage applications requiring a thick SJ drift layer structure. Manufacturing a 8 kV SiC based SJ power semiconductor device would require to repeat the epitaxy and implantation steps 20 times, respectively.

From the publication "Design and Experimental Demonstration of 1.35 kV SiC Super Junction Schottky Diode" by X. Zhong et al., Proceedings of the 2016 28th Internations Symposium on Power Semiconductor Devices and ICs (ISPSD), Jun. 12-16, 2016, Czech Republic, pages 231 to 234, there is known a SiC based SJ junction barrier Schottky (JBS) diode that comprises a SJ drift layer structure manufactured by tilted ion implantation of the side walls of 6 µm deep trenches in a 12 µm-thick epi-layer and subsequent refilling of the trenches with silicon dioxide ($SiO_2$). With the described method doping control and accurate charge balance can hardly be achieved.

In another method for fabricating the SJ drift layer structure of a SiC based SJ power semiconductor device, which is known from the publication "Development of SiC super-junction (SJ) device by deep trench-filling epitaxial growth" by R. Kosugi et al., Materials Science Forum Vols. 740-742 (2013), pages 785 to 788, trenches in an n-type 4H—SiC epitaxial layer are refilled by epitaxial growth of 4H—SiC in the trenches. This refilling method requires high growth temperature during the refilling step by epitaxial growth. Also there is a high risk of void formation and non-uniform doping, seriously compromising reliability and blocking capability of devices manufactured by the method described in this publication.

In another prior art document US 2016/0087032 A1, void formation during refilling of trenches in a 4H—SiC layer is reduced by widening an opening of the trenches, respectively, which results in a structure having a relatively high ON resistance.

SUMMARY OF THE INVENTION

In view of the above it is an object of the invention to provide a SiC based superjunction (SJ) power semiconductor device, which can be manufactured in a time and cost efficient manner with good control of the doping and without introducing voids to reliably obtain good and reproducible results. It is another object of the invention to manufacture such SiC based SJ power semiconductor device in a time and cost efficient manner with good control of the doping and without introducing voids.

The object is attained by a power semiconductor device according to claim 1.

The power semiconductor device according to the invention comprises a semiconductor wafer having a first main side surface and a second main side surface. The semiconductor wafer includes a first semiconductor layer having a first conductivity type and a plurality of columnar or plate-shaped first semiconductor regions extending in the first semiconductor layer between the first main side surface and the second main side surface in a vertical direction perpendicular to the first main side surface and the second main side surface. The first semiconductor regions have a second conductivity type, which is different from the first conductivity type. Therein, the first semiconductor layer is a layer of hexagonal silicon carbide. The first semiconductor regions are regions of 3C polytype cubic silicon carbide.

The use of cubic silicon carbide material for the columnar or plate-shaped first semiconductor regions allows a manufacture of the power semiconductor device in a reliable manner without voids and defects that are often encountered when refilling a trench in hexagonal silicon carbide with hexagonal silicon carbide, because cubic silicon carbide is a highly conforming polytype of silicon carbide. The lack of a valence band offset between the hexagonal silicon carbide and the cubic silicon carbide results in a junction between the hexagonal silicon carbide and the cubic silicon carbide which has favourable electronic properties.

Further developments of the invention are specified in the dependent claims.

In an exemplary embodiment, the power semiconductor device is a SJ power semiconductor device, in which the first semiconductor layer is a drift layer having a thickness in the vertical direction of at least 3 µm and having a doping concentration below $2 \cdot 10^{17}$ cm$^{-3}$. The use of a drift layer having a relatively low doping concentration can increase the breakdown voltage by lowering the electric field in the space charge region of a blocking junction of the power semiconductor device.

In an exemplary embodiment the cubic silicon carbide is polycrystalline 3C—SiC, which has the highest electron mobility and saturation velocity of all known silicon carbide polytypes because of reduced phonon scattering resulting from the higher symmetry.

The first semiconductor regions may respectively be separated from the first semiconductor layer by a second semiconductor region of hexagonal silicon carbide having the second conductivity type. The use of the second semiconductor region results in optimum control of the charge balance in the drift layer of the power semiconductor device.

In an exemplary embodiment, the first semiconductor layer is single crystalline. A single crystal has characteristics that are exemplarily preferable for a power semiconductor device, such as a relatively high electron and hole mobility compared to a polycrystalline material where the mobility of electrons and holes is lowered by scattering at the grain boundaries.

The hexagonal silicon carbide in the power semiconductor device of the invention may be 4H—SiC or 6H—SiC, for example. These polytypes of silicon carbide have superior electronic properties compared to other hexagonal polytypes of silicon carbide.

In an exemplary embodiment, the semiconductor wafer comprises a second semiconductor layer on the first semiconductor layer towards the second main side surface and an electrode layer formed on the second semiconductor layer on a side opposite to the first semiconductor layer to form an ohmic contact to the second semiconductor layer, wherein the second semiconductor layer has a doping concentration which is at least 10 times as high as the doping concentration in the first semiconductor layer. With the use of the highly doped second semiconductor layer a good ohmic contact to the electrode layer formed on the second semiconductor layer on a side opposite to the first semiconductor layer can be achieved.

Each pair of neighbouring first semiconductor regions neighbouring to each other in a horizontal direction parallel to the first main side surface and the second main side surface may exemplarily be separated from each other in the horizontal direction by a portion of the first semiconductor layer so that the first semiconductor regions alternate with the portions of the first semiconductor layer in the horizontal direction. Such alternating structure results in good blocking behaviour and a relatively high ON state voltage of the power semiconductor device.

Therein, for each first semiconductor region, a vertical width of the first semiconductor region in a vertical direction perpendicular to the first main side surface and the second main side surface may exemplarily be at least two times a horizontal width of the first semiconductor region in the horizontal direction. Throughout the specifications of the the present patent application, a width of a region in a certain direction is a maximum width of the region in that certain direction, i.e. the length of a line which has the maximum length among all lines extending inside the region in that certain direction. With first semiconductor regions which are relatively small in the horizontal direction a good compromise between good blocking behaviour and relatively high ON state voltage of the power semiconductor device can be achieved.

The vertical width of each first semiconductor region may exemplarily be at least 3 µm, or may be exemplarily at least 4 µm. With a relatively high vertical width of the first semiconductor regions a good compromise between good blocking behaviour and relatively high ON state voltage of the power semiconductor device can be achieved.

In an exemplary embodiment a distance between each pair of neighbouring first semiconductor regions is in a range from 2 µm to 20 µm. A distance between each pair of neighbouring first semiconductor regions in a range from 2 µm to 20 µm allows a good charge balance in the drift layer.

Each first semiconductor region may extend into the first semiconductor layer in the vertical direction to a depth of at least at least 3 µm, exemplarily of at least 4 µm from a first main side of the first semiconductor layer facing the first main side surface of the semiconductor wafer. A depth of at least at least 3 µm, exemplarily of at least 4 µm from a first main side of the first semiconductor layer facing the first main side surface of the semiconductor wafer allows a good charge balance in the drift layer.

The power semiconductor device of the invention may be manufactured by a method according to anyone of claims 13 to 15. Such method for manufacturing the power semiconductor device of the invention allows to manufacture the drift layer without void formation and uniform doping to manufacture power semiconductor devices with high reliability and good blocking capability.

BRIEF DESCRIPTION OF THE DRAWINGS

Detailed embodiments of the invention will be explained below with reference to the accompanying figures, in which.

The reference signs used in the figures and their meanings are summarized in the list of reference signs. Generally, similar elements have the same reference signs throughout the specification. The described embodiments are meant as examples and shall not limit the scope of the invention.

DETAILED DESCRIPTION OF PREFERRED EMBODIMENTS

Figure 1:
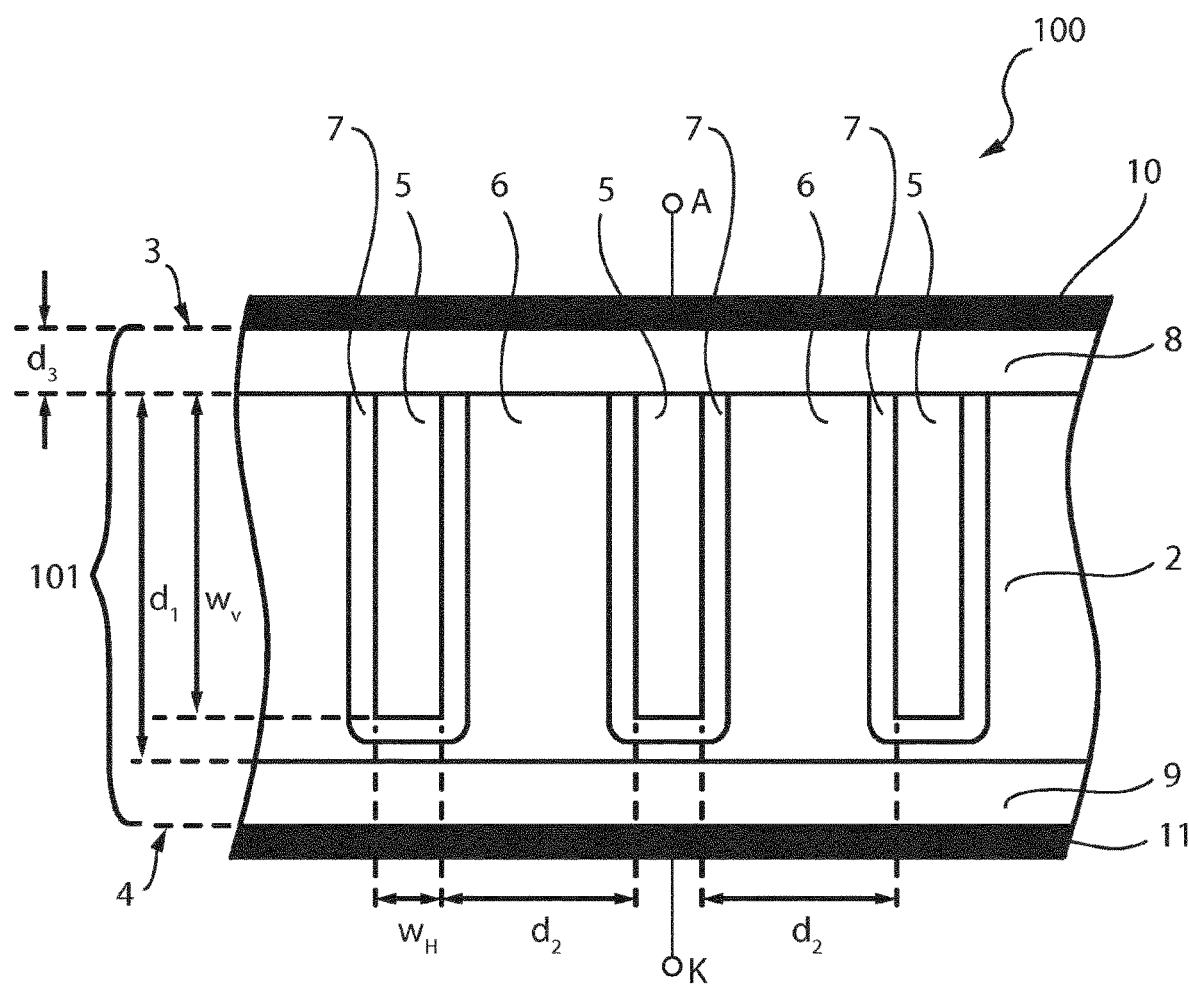
FIG. 1 shows a partial cross sectional view of a power semiconductor device according to a first embodiment of the invention.

FIG. 1 shows a partial cross sectional view of a power semiconductor device according to a first embodiment of the invention. The power semiconductor device according to the first embodiment is a superjunction (SJ) power diode 100. It comprises a semiconductor wafer 101 having a first main side surface 3 and a second main side surface 4 opposite to the first main side surface 3. It includes in an order from the first main side surface 3 to the second main side surface 4, a p$^+$-type anode layer 8, an n$^-$-type drift layer 2, and an n$^+$-type substrate layer 9. The drift layer 2 is an example for a first semiconductor layer in the claims and the substrate layer 9 is an example for a second semiconductor layer in the claims. The anode layer 8, the drift layer 2, and the substrate layer 9 are made of silicon carbide (SiC), which has a hexagonal polytype such as 4H—SiC or 6H—SiC. Also, the anode layer 8, the drift layer 2, and the substrate layer 9 may be single crystalline and may all have the same crystal orientation. The thickness $d_1$ and the doping concentration of the drift layer depend on the voltage class of the SJ power diode 100. Exemplarily, it has a thickness $d_1$ in the vertical direction of at least 3 μm, more exemplarily at least 4 μm, and has a doping concentration below $2 \cdot 10^{17}$ cm$^{-3}$, more exemplarily below $1 \cdot 10^{17}$ cm$^{-3}$. For a 1.2 kV device the drift layer would require a thickness of about 8 to 10 μm, whereas for a 6.5 kV device the drift layer would require a thickness of about 40 to 50 μm to sustain the blocking voltage.

A main pn-junction of the SJ power diode 100 is formed at the interface between the drift layer 2 and the anode layer 8. On the first main side surface 3 of the semiconductor wafer 101 there is formed a first electrode layer 10, which forms the anode electrode of the SJ power diode 100. On the second main side surface 4 of the semiconductor wafer 101 there is formed an electrode layer as a second electrode layer 11, which forms a cathode electrode of the SJ power diode 100. The first electrode layer 10 forms an ohmic contact with the anode layer 8, while the second electrode layer 11 forms an ohmic contact with the substrate layer 9. To provide a good ohmic contact the substrate layer 9 may have a doping concentration which is exemplarily at least 10 times higher than that of the drift layer 2. In FIG. 1 there is also schematically indicated an anode terminal A electrically connected to the first electrode layer 10 and a cathode terminal K electrically connected to the second electrode layer 11.

As also shown in FIG. 1, a plurality of columnar or plate-shaped first semiconductor regions 5 extend from an upper side of the drift layer 2 into the drift layer 2. The first semiconductor regions 5 extend between the first main side surface 3 and the second main side surface 4 in a vertical direction perpendicular to the first main side surface 3 and the second main side surface 4. The first semiconductor regions 5 are regions of p-type cubic SiC. The cubic SiC of the first semiconductor regions 5 has a 3C—SiC polytype. As a dopant for the first semiconductor regions 5 boron (B), aluminium (Al) or other group-III-elements may be used, for example. The cubic SiC material of the first semiconductor regions 5 may be polycrystalline. In the first embodiment the first semiconductor regions 5 are respectively separated from the drift layer 2 by a p-type second semiconductor region 7 of hexagonal silicon carbide, respectively. Each of the second semiconductor regions 7 is surrounding one of the first semiconductor regions 5 in the drift layer 2. The region formed by the first semiconductor region 5 and the second semiconductor region 7 surrounding this first semiconductor region 5 may also be named a p-type pillar in the field of SJ power semiconductor devices, where the term pillar is used for columnar and plate-shaped regions. Throughout the specifications a columnar region is defined as a region having a vertical width which is larger than any horizontal width thereof, while a plate-shaped region has a vertical width which is larger than a horizontal direction, which is perpendicular to the plate-shaped region. In the case of the first semiconductor regions 5, a vertical direction means a direction perpendicular to the first and second main side surface 3, 4, while a horizontal direction means a direction parallel to the first and second main side surface 3, 4. A horizontal width shall correspond to the largest diameter of a circle that can be laid into the layer in a plane parallel to the first main side surface.

Each pair of neighbouring first semiconductor regions 5 neighbouring to each other in a horizontal direction parallel to the first main side surface 3 and the second main side surface 4 are separated from each other in the horizontal direction by a portion 6 of the first semiconductor layer 2 so that the first semiconductor regions 5 alternate with the portions 6 of the first semiconductor layer 2 in the horizontal direction. In the field of SJ power semiconductor devices these portions 6 of the drift layer 2 may also be named n-type pillars, such that in the SJ power diode 100 n-type pillars alternate with p-type pillars in a horizontal direction to form a SJ drift layer structure. The pn-junction between the anode layer 8 and the portion 6 of the drift layer 2 between two neighbouring first semiconductor regions 5 is a first example for a power device cell.

Each first semiconductor region 5 has a vertical width $w_V$ in a vertical direction perpendicular to the first main side surface 3 and the second main side surface 4, which is exemplarily greater than a horizontal width $w_H$ of the first semiconductor region 5 in the horizontal direction, in which the first semiconductor regions 5 alternate with the portions 6 of the first semiconductor layer 2. In the first embodiment the vertical width of the first semiconductor region 5 is the depth, to which the first semiconductor regions 5 extend from the upper side of the drift layer 2, which is the first main side of the first semiconductor layer in the claims. The drift layer 2 and the first semiconductor regions 5 are separated from the first main side surface 3 by the anode layer 8. Accordingly, the depth to which the first semiconductor regions 5 extend from the first main side surface 3 is the vertical width $w_V$ plus the thickness $d_3$ of the anode layer 8.

Exemplarily the vertical width $w_V$ is at least two times the horizontal width $w_H$. The vertical width $w_V$ of each first semiconductor region 5 is exemplarily at least 3 μm, more exemplarily at least 4 μm. A distance $d_2$ between each pair of neighbouring first semiconductor regions 5 is exemplarily in a range from 2 μm to 20 μm.

Next a method for manufacturing the SJ power diode of FIG. 1 is explained with reference to FIGS. 2A to 2E. With regard to geometric characteristics (such as distances, widths or thicknesses), doping concentrations of described regions or layers it is referred to the description of the SJ power diode 100 above.

In a first method step an n-type epi-layer of hexagonal silicon carbide 2, which forms the drift layer 2 in the final SJ power diode 100, is formed on a substrate layer 9. The layer of hexagonal silicon carbide 2 has a first main side 23 and a second main side 24 opposite to the first main side 23.

Figure 2A:
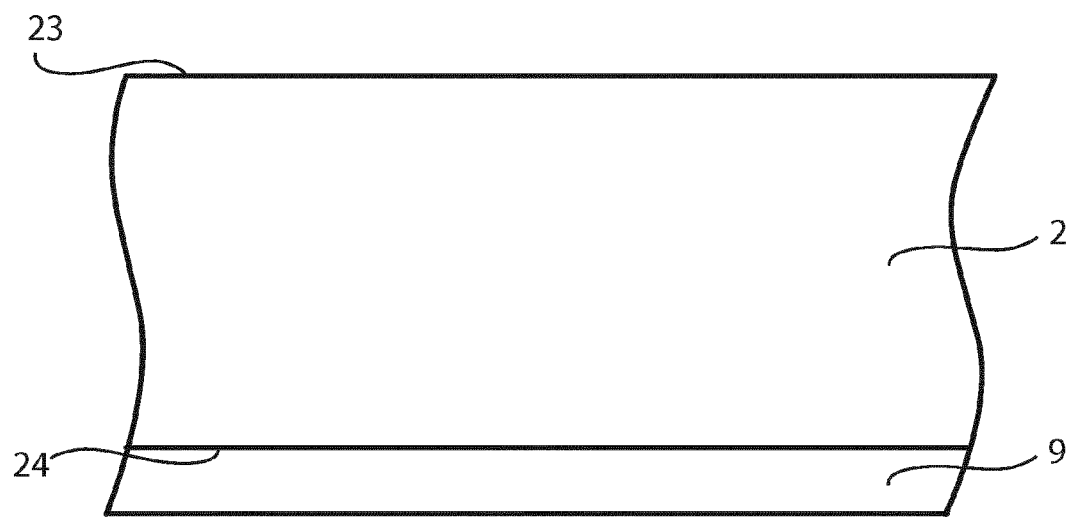
FIGS. 2A to 2E show partial cross sectional views illustrating different steps of a method for manufacturing the power semiconductor device of FIG. 1.

The resulting structure comprising the n-type epi-layer of hexagonal silicon carbide 2 and the substrate layer 9 is shown in FIG. 2A. The first main side 24 is the upper side of the epi-layer of hexagonal silicon carbide 2 in FIG. 2A.

Figure 2B:
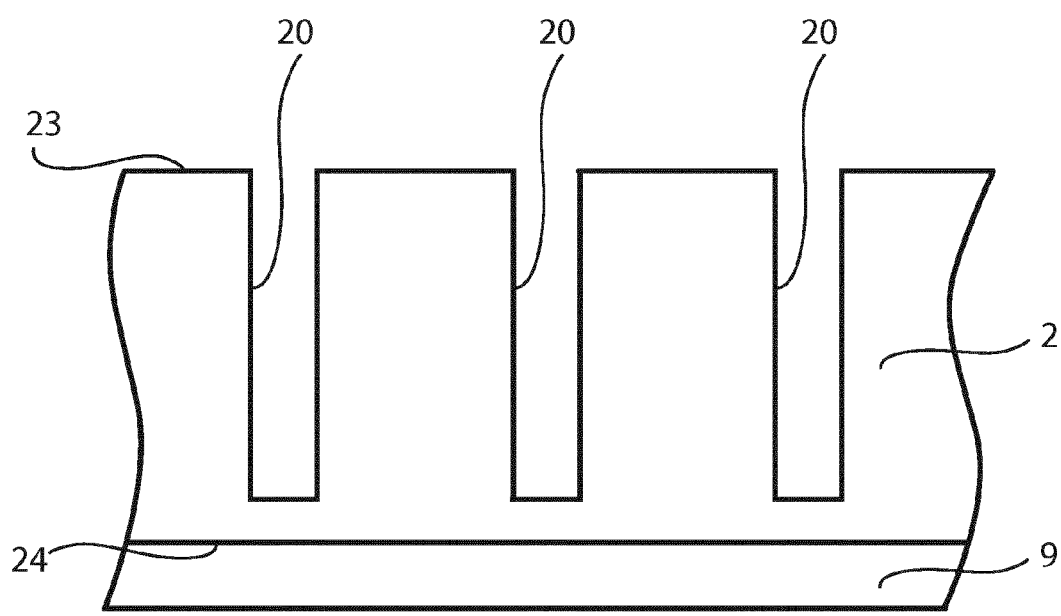
Figure 2C:
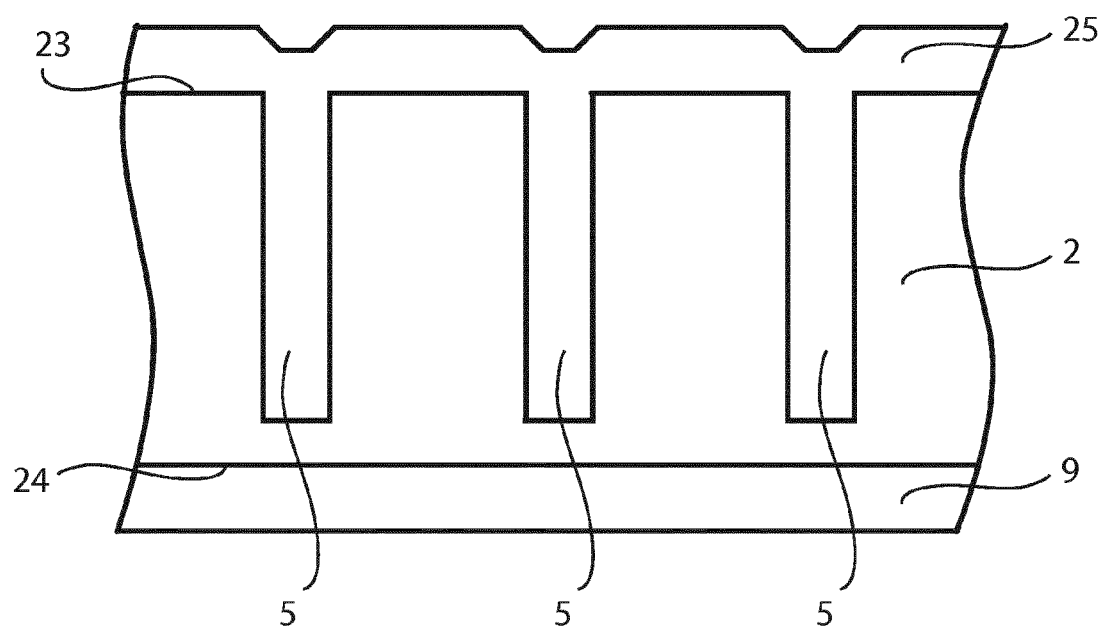
Figure 2D:
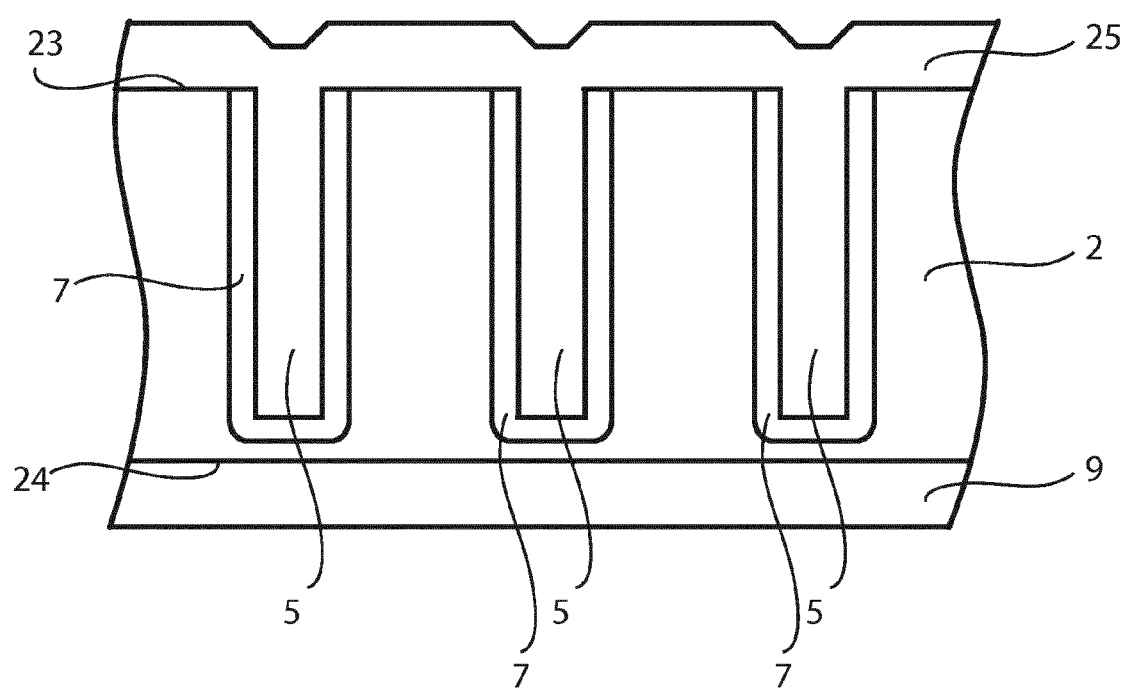

In a next method step illustrated in FIG. 2B a plurality of trenches 20 is formed in the epi-layer of hexagonal silicon carbide 2 from its first main side 23 by selective etching. Subsequently, the trenches 20 are refilled with a layer of p-type cubic silicon carbide 25 as shown in FIG. 2C to form the columnar or plate-shaped regions 5 of cubic silicon carbide, which extend from the first main side 23 into the layer of hexagonal silicon carbide 2. Exemplarily, refilling the trenches 20 with the layer of cubic silicon carbide 25 is done by chemical vapour deposition at a temperature below 1100° C. Refilling is exemplarily performed by CVD using silacyclobutane (SCB) as a single source precursor in a temperature range of 800 to 900° C., for example. However, any other method for forming cubic SiC may be used to deposit the cubic SiC to refill the trenches 20. The second semiconductor regions 7 are formed in an annealing step as illustrated in FIG. 2D. In this annealing step p-type dopants diffuse from the p-type cubic silicon carbide 25 into the drift layer 2 to form the second semiconductor regions 7.

Figure 2E:
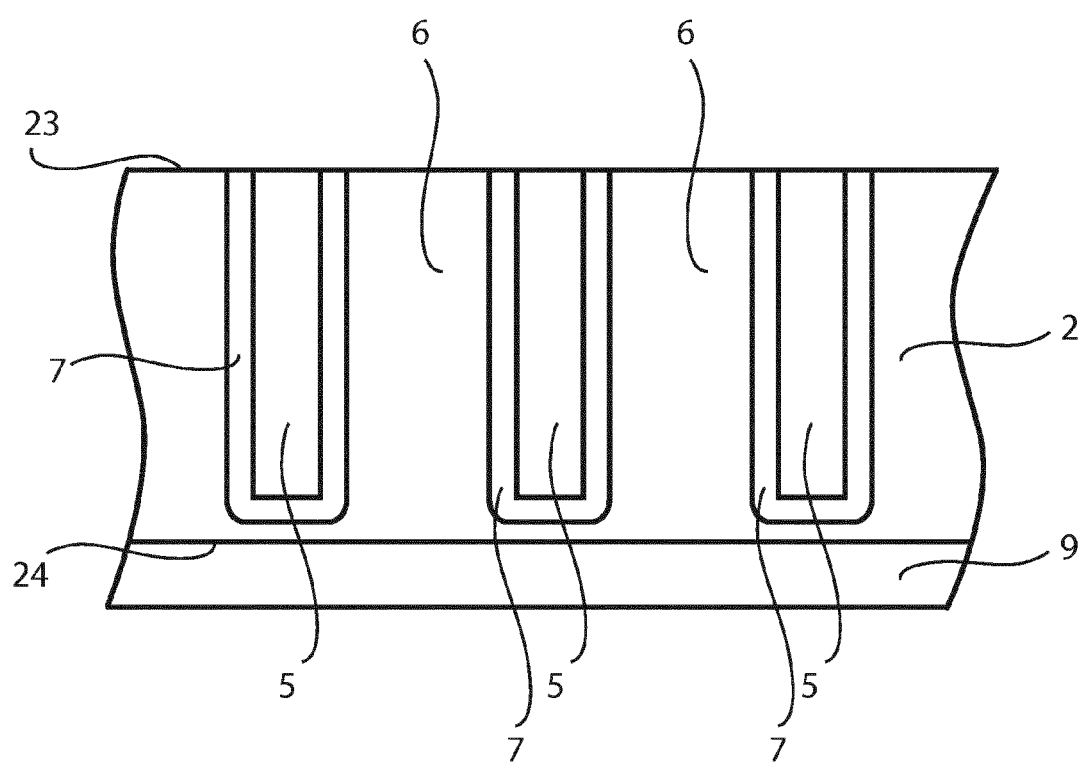

Subsequent to the deposition of the layer of p-type cubic silicon carbide 25 and the before mentioned annealing step, a planarization step is performed to remove the portion of the layer of p-type cubic silicon carbide 25 which is present outside of trenches 20 and to expose the epi-layer of hexagonal silicon carbide 2. The resulting structure is shown in FIG. 2E.

Next the anode layer 8 is formed on the first main side 23 of epi-layer of hexagonal silicon carbide 2, the first electrode layer 10 is formed on the anode layer 8, and the second electrode layer 11 is formed on the substrate layer 9 on the backside of the device to obtain the SJ power diode 101 shown in FIG. 1. When forming the anode layer 8 on the first main side 23, a power device cell is formed in an area between each pair of two columnar or plate-shaped regions 5 of cubic silicon carbide neighbouring to each other in a horizontal direction parallel to the first main side 23 and the second main side 24. A power cell of a power semiconductor device shall mean throughout this specification a part of such power semiconductor device which has full functionality of a power device, and which forms the power semiconductor device together with other power device cells, which have basically the same structure. In a vertical power semiconductor device the main current flows in parallel through the individual power device cells.

Figure 3:
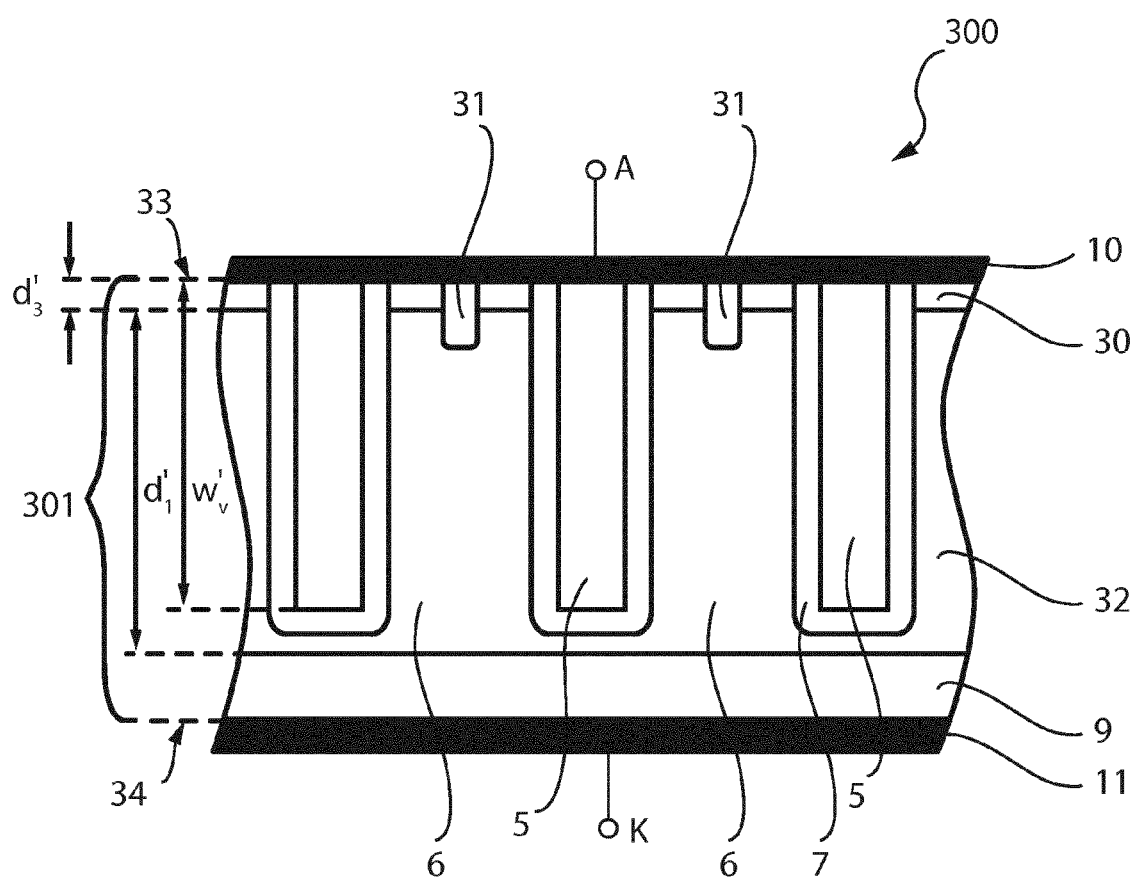
FIG. 3 shows a partial cross sectional view of a power semiconductor device according to a second embodiment of the invention.

In FIG. 3 there is shown a power semiconductor device according to a second embodiment. Due to the many similarities between the first and the second embodiment only differences between the two embodiments will be described in the following. With regard to the remaining features it is referred to the discussion of the first embodiment above. Elements in FIG. 3, which are indicated with the same reference signs as elements in the first embodiment, have the same properties and characteristics as discussed above for the first embodiment. A discussion of such elements may not be repeated. The power semiconductor device according to the second embodiment is a SJ trench junction barrier Schottky (JBS) rectifier 300 comprising a semiconductor wafer 301 having a first main side surface 33 and a second main side surface 34 opposite to the first main side surface 33.

In an order from the second main side surface 34 to the first main side surface 33, the semiconductor wafer 301 comprises an n⁺-type substrate layer 9, an n⁻-type drift layer 32, and an n-type layer 30 having a higher doping concentration than the drift layer 32. A plurality of p⁺-type regions 31 extend from the first main side surface 33 through the n-type layer 30 into the drift layer 32. The n-type layer 30 has a higher doping concentration than the drift layer 32 for adjusting the electric field peak near the p⁺-type regions 31 during operation of the SJ trench JBS rectifier 300. The substrate layer 9, the drift layer 32, the n-type layer 30 and the plurality of p⁺-type regions 31 are all made of hexagonal SiC, exemplarily they are made of 4H—SiC or 6H—SiC. Further, they may be single crystalline and may all have the same crystal orientation. The doping concentration and the thickness of the drift layer 32 depend on the voltage class of the SJ trench JBS rectifier in the same manner as discussed above for the drift layer 2 in the first embodiment.

As in the first embodiment a plurality of columnar or plate-shaped first semiconductor regions 5 extend into the drift layer 32. However, while in the first embodiment the upper sides of the first semiconductor regions 5 are flush with the upper side of the drift layer 2, in the second embodiment the first semiconductor regions 5 extend from the first main side surface 33 through the n-type layer 30 into the drift layer 32. With respect to the first semiconductor regions 5, the only difference between the first and the second embodiment is that in the second embodiment the first semiconductor regions 5 extend through n-type layer 30 before extending into the drift layer 32, while in the first embodiment the first semiconductor regions 5 extend from the first main side of the drift layer 2. All other characteristics of the first semiconductor regions 5 including its material properties are the same as in the first embodiments. Also the alternating arrangement of the first semiconductor regions 5 and the portions 6 of the first semiconductor layer 32 in the horizontal direction is the same as in the first embodiment. Accordingly, the SJ drift layer structure formed by the drift layer 32, the first semiconductor regions 5 and the second semiconductor regions 7 is the same as in the first embodiment except that the p⁺-type regions 31 extend into the drift layer 32.

As in the first embodiment a first electrode layer 10 is formed on the first main side surface 33 of the semiconductor wafer 301 to form an ohmic contact with the n-type layer 30, the p⁺-type regions 31, the first semiconductor regions 5 and the second semiconductor regions 7, respectively.

Between any two neighbouring first semiconductor regions 5 there is formed a trench JBS cell including a single p⁺-type region 31 and a portion of the n-type layer 30. The trench JBS cell formed between two neighbouring first semiconductor regions 5 is a second example for a power device cell.

In the first embodiment the vertical width $w_v$ of the first semiconductor region 5 is the depth, to which the first semiconductor regions 5 extend from the upper side of the drift layer 2. However, in the second embodiment the depth to which the first semiconductor regions 5 extend from the upper side of the drift layer 32 is smaller than the vertical width $w_v'$ of the first semiconductor region 5 by a thickness $d_3'$ of n-type layer 30. In the second embodiment the vertical width $w_v'$ of the first semiconductor regions 5 is the depth to which the first semiconductor regions 5 extend from the first main side surface 33. In an exemplary embodiment, the depth to which the first semiconductor regions 5 extend from the upper side of the drift layer 32 is at least 3 μm, more exemplarily at least 4 μm.

A method for manufacturing the SJ trench JBS rectifier 300 is similar to the method for manufacturing the SJ power diode 100 as discussed above with FIGS. 2A to 2E. It differs from the method discussed with FIGS. 2A to 2E only in that the n-type layer 30 and the p$^+$-type region 31 are formed before forming trenches through the n-type layer 30 into the drift layer 32. Further, no anode layer is formed after refilling the trenches.

Figure 4:
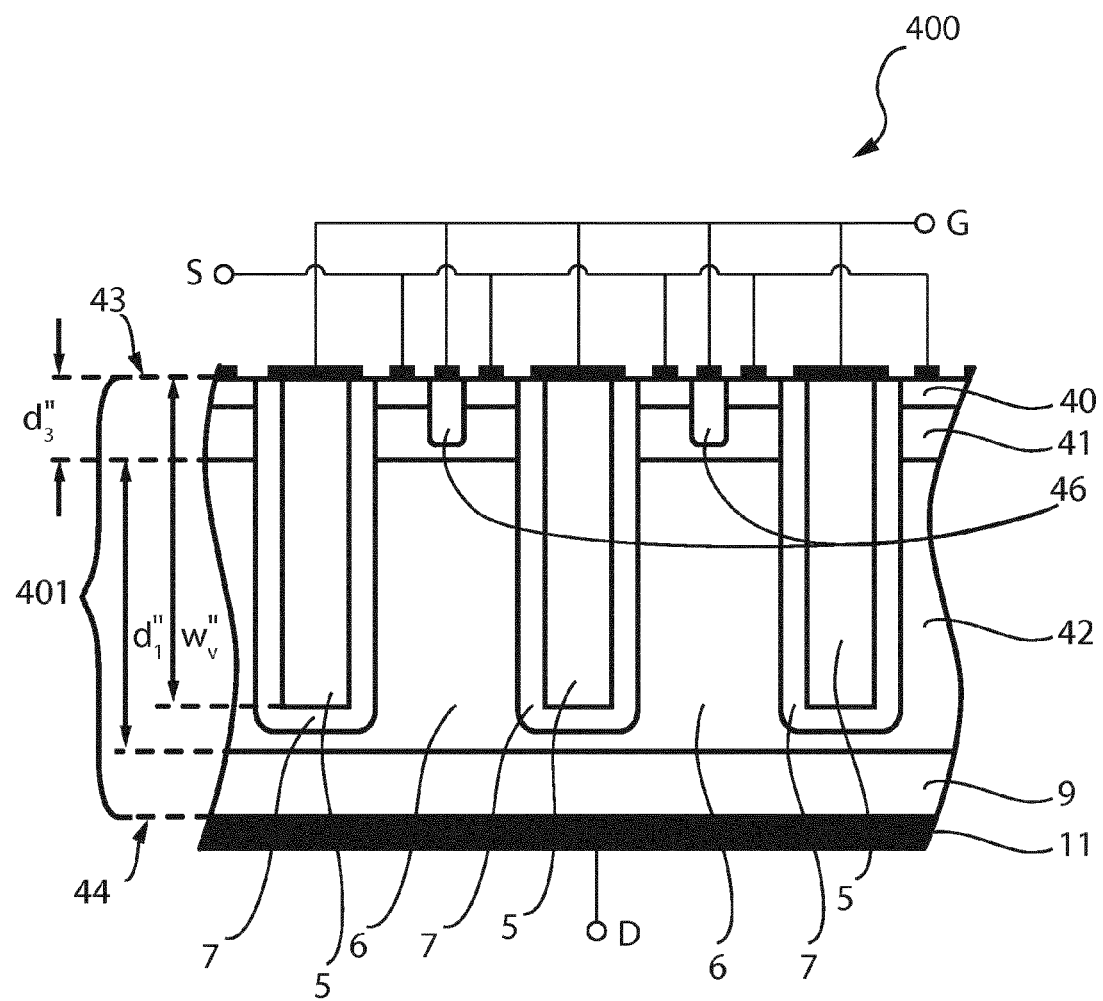
FIG. 4 shows a partial cross sectional view of a power semiconductor device according to a third embodiment of the invention.

In FIG. 4 there is shown a power semiconductor device according to a third embodiment. Due to the many similarities between the third embodiment and the first embodiment discussed above only differences of the third embodiment to the two first embodiment discussed above will be described in the following. With regard to the remaining features it is again referred to the discussion of the first embodiment above. Elements in FIG. 4 which are indicated with the same reference signs as elements in the first embodiment have the same properties and characteristics as discussed above. A discussion of such elements may not be repeated. The power semiconductor device according to the third embodiment is a SJ trench junction field effect transistor (JFET) 400 comprising a semiconductor wafer 401 having a first main side surface 43 and a second main side surface 44 opposite to the first main side surface 43.

In an order from the second main side surface 44 to the first main side surface 43, the semiconductor wafer 401 comprises an n$^+$-type substrate layer 9, an n$^-$-type drift layer 42, an n-type channel layer 41 and an n$^+$-type source layer 40. A plurality of p$^+$-type gate regions 46 extend from the first main side surface 43 through the source layer 40 into the channel layer 41. The source layer 40 has a higher doping concentration than the channel layer 41, and the channel layer 41 has a higher doping concentration than the drift layer 42. The substrate layer 9, the drift layer 42, the channel layer 41, the source layer 40, and the plurality of gate regions 46 are all made of hexagonal SiC, exemplarily they are made of 4H—SiC or 6H—SiC. Further, they may be single crystalline and may all have the same crystal orientation. The doping concentration and the thickness of the drift layer 42 depend on the voltage class of the SJ trench JFET 400 in the same manner as discussed above for the drift layer 2 in the first embodiment.

As in the first and the second embodiment a plurality of columnar or plate-shaped first semiconductor regions 5 extend into the drift layer 42 of the SJ trench JFET 400 according to the third embodiment. However, while in the first embodiment the upper sides of the first semiconductor regions 5 are flush with the upper side of the drift layer 2, in the third embodiment the first semiconductor regions 5 extend from the first main side surface 43 through the source layer 40 and the channel layer 41 into the drift layer 42. With respect to the first semiconductor regions 5, the only difference between the first and the third embodiment is that in the third embodiment the first semiconductor regions 5 extend through the source layer 40 and the channel layer 41 before extending into the drift layer 42, while in the first embodiment the first semiconductor regions 5 do not extend above the first main side of the drift layer 2, i.e. do not extend outside of the drift region 2. All other properties and characteristics of the first semiconductor regions 5 including its material properties are the same as in the first embodiment. Also the alternating arrangement of the first semiconductor regions 5 and the portions 6 of the first semiconductor layer 32 in the horizontal direction are the same as in the first embodiment. Accordingly, the SJ drift layer structure formed by the drift layer 42, the first semiconductor regions 5 and the second semiconductor regions 7 is the same as the SJ drift layer structure formed in the first embodiment by the drift layer 2, the first semiconductor regions 5 and the second semiconductor regions 7.

On a front side of the SJ trench JFET 400 a source terminal S is electrically connected to a source electrode making an ohmic contact with the source layer 40 at the first main side surface 43. Also on the front side of the SJ trench JFET 400 a gate terminal G is electrically connected to a gate electrode making an ohmic contact with the first semiconductor regions 5 and the second semiconductor regions 7. On a backside of the SJ trench JFET 400 a drain terminal D is electrically connected to the second electrode layer 11.

Between any two neighbouring first semiconductor regions 5 there is formed a trench JFET cell including a gate region 46, a portion of the source layer 40 and a portion of the channel layer 41. The trench JFET cell formed between two neighbouring first semiconductor regions 5 is a third example of a power device cell.

In view of the fact that, in the third embodiment, the first semiconductor regions 5 extend from the first main side surface 43 through the source layer 40 and the channel layer 41 into the drift layer 42, the depth to which the first semiconductor regions 5 extend from the upper side of the drift layer 42 is smaller than the vertical width $w_v$" of the first semiconductor regions 5 by the total thickness $d_3$" of the source layer 40 and the channel layer 41. In the third embodiment the vertical width $w_v$" of the first semiconductor regions 5 is the depth to which the first semiconductor regions 5 extend from the first main side surface 43. In an exemplary embodiment, the depth to which the first semiconductor regions 5 extend from the upper side of the drift layer 32 is at least 3 µm, more exemplarily at least 4 µm.

A method for manufacturing the SJ trench JFET 400 is similar to the method for manufacturing the SJ power diode 100 as discussed above with FIGS. 2A to 2E. It differs from the method discussed with FIGS. 2A to 2E in that the source layer 40 and the channel layer 41 are formed before forming trenches, to be refilled with cubic silicon carbide, through these layers into the drift layer 32, no anode layer 8 is formed after refilling the trenches, and gate regions 46 are formed in the semiconductor wafer 401 to extend from the first main side surface 43 through the source layer 40 into the channel layer 41. Source electrodes and gate electrodes are finally formed to make proper electrical connection of the SJ trench JFET 400 to the source terminal S and the gate terminal G.

Figure 5:
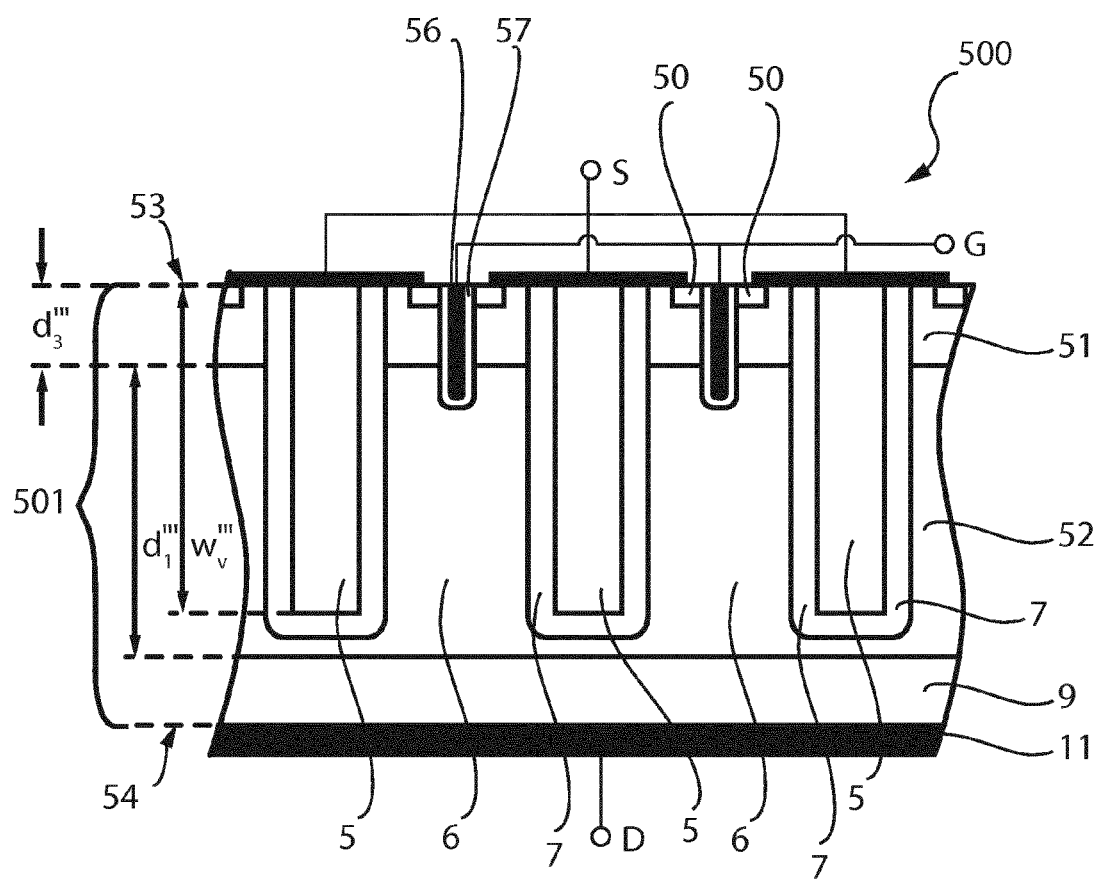
FIG. 5 shows a partial cross sectional view of a power semiconductor device according to a fourth embodiment of the invention.

In FIG. 5 there is shown a power semiconductor device according to a fourth embodiment. Due to the many similarities between the fourth embodiment and the first embodiment discussed above only differences of the fourth embodiment to the first embodiment discussed above will be described in the following. With regard to the remaining features it is referred to the discussion of the first embodiment above. Elements in FIG. 5 which are indicated with the same reference signs as elements in the first embodiment have the same properties as discussed above. A discussion of such elements may not be repeated. The power semiconductor device according to the fourth embodiment is a SJ trench metal oxide semiconductor field effect transistor (MOSFET) 500 comprising a semiconductor wafer 501 having a first main side surface 53 and a second main side surface 54 opposite to the first main side surface 53.

In an order from the second main side surface 54 to the first main side surface 53, the semiconductor wafer 501 comprises an n$^+$-type substrate layer 9, an n$^-$-type drift layer 52, a p-type base layer 51 and an n$^+$-type source layer 50. A plurality of trench gate electrodes 56 extend from the first main side surface 53 through the source layer 50 and the base layer 51 into the drift layer 52. Each trench gate electrode 56 is separated from the base layer 51 by a gate dielectric layer 57. The source layer 50 has a higher doping concentration than the drift layer 52. The substrate layer 9, the drift layer 52, the channel layer 51, and the source layer 50 are all made of hexagonal SiC. Exemplarily they are made of 4H—SiC or 6H—SiC. Further, they may be single crystalline and may all have the same crystal orientation. The doping concentration and the thickness of the drift layer 52 depend on the voltage class of the SJ trench MOSFET 500 in the same manner as discussed above for the drift layer 2 in the first embodiment.

As in the first to third embodiment a plurality of columnar or plate-shaped first semiconductor regions 5 extend into the drift layer 52 of the SJ trench MOSFET 500 according to the fourth embodiment. However, while in the first embodiment the upper sides of the first semiconductor regions 5 are flush with the upper side of the drift layer 2, in the fourth embodiment the first semiconductor regions 5 extend from the first main side surface 53 through the source layer 50 and the base layer 51 into the drift layer 52. With respect to the first semiconductor regions 5, the only difference between the first and the fourth embodiment is that in the fourth embodiment the first semiconductor regions 5 extend through the source layer 50 and the channel layer 51 before extending into the drift layer 52, while in the first embodiment the first semiconductor regions 5 do not extend above the first main side of the drift layer 2, i.e. do not extend outside of the drift layer 2. All other properties and characteristics of the first semiconductor regions 5 including its material properties are the same as in the first embodiments. The first semiconductor regions are formed of cubic SiC and the alternating arrangement of the first semiconductor regions 5 and the portions 6 of the drift layer 52 in the horizontal direction is the same as in the first embodiment. Accordingly, the SJ drift layer structure formed by the drift layer 52, the first semiconductor regions 5 and the second semiconductor regions 7 is the same as the SJ drift layer structure formed by the drift layer 2, the first semiconductor regions 5 and the second semiconductor regions 7 in the first embodiment.

On a front side of the SJ trench MOSFET 500 a source terminal S is electrically connected to a source electrode making an ohmic contact with the source layer 50, the base layer 51, the first semiconductor regions 5 and the second semiconductor regions 7 at the first main side surface 53. Also on the front side of the SJ trench MOSFET 500 a gate terminal G is electrically connected to the trench gate electrodes 56, respectively. On a backside of the SJ trench MOSFET 500 a drain terminal D is electrically connected to the second electrode layer 11.

Between any two neighbouring first semiconductor regions 5 there is formed a trench MOSFET cell including a trench gate electrode 56, a portion of the source layer 50 and a portion of the base layer 51. The trench MOSFET cell formed between two neighbouring first semiconductor regions 5 is a fourth example of a power device cell.

In view of the fact that the first semiconductor regions 5 extend from the first main side surface 53 through the base layer 51 (and through the source layer 50 formed as a well in the base layer 51) into the drift layer 42, the depth to which the first semiconductor regions 5 extend from the upper side of the drift layer 42 is smaller than the vertical width $w_v'''$ of the first semiconductor regions 5 by the thickness $d_3'''$ of the base layer 51. In the fourth embodiment the vertical width $w_v'''$ of the first semiconductor regions 5 is the depth to which the first semiconductor regions 5 extend from the first main side surface 53. In an exemplary embodiment, the depth to which the first semiconductor regions 5 extend from the upper side of the drift layer 52 is at least 3 µm, more exemplarily at least 4 µm.

A method for manufacturing the SJ trench MOSFET 500 is similar to the method for manufacturing the SJ power diode 100 as discussed above with FIGS. 2A to 2E. It differs from the method discussed with FIGS. 2A to 2E in that the source layer 50 and the channel layer 51 are formed, before forming trenches to be refilled with cubic silicon carbide, through these layers into the drift layer 52, no anode layer 8 is formed after refilling the trenches, and gate electrodes 56 and gate dielectric layers 57 are formed in the semiconductor wafer 501 to extend from the first main side surface 53 through the source layer 50 and the base layer 51 into the drift layer 52. Source electrodes and gate electrodes are finally formed to make proper electrical connection of the SJ trench MOSFET 500 to the source terminal S and the gate terminal G.

Figure 6:
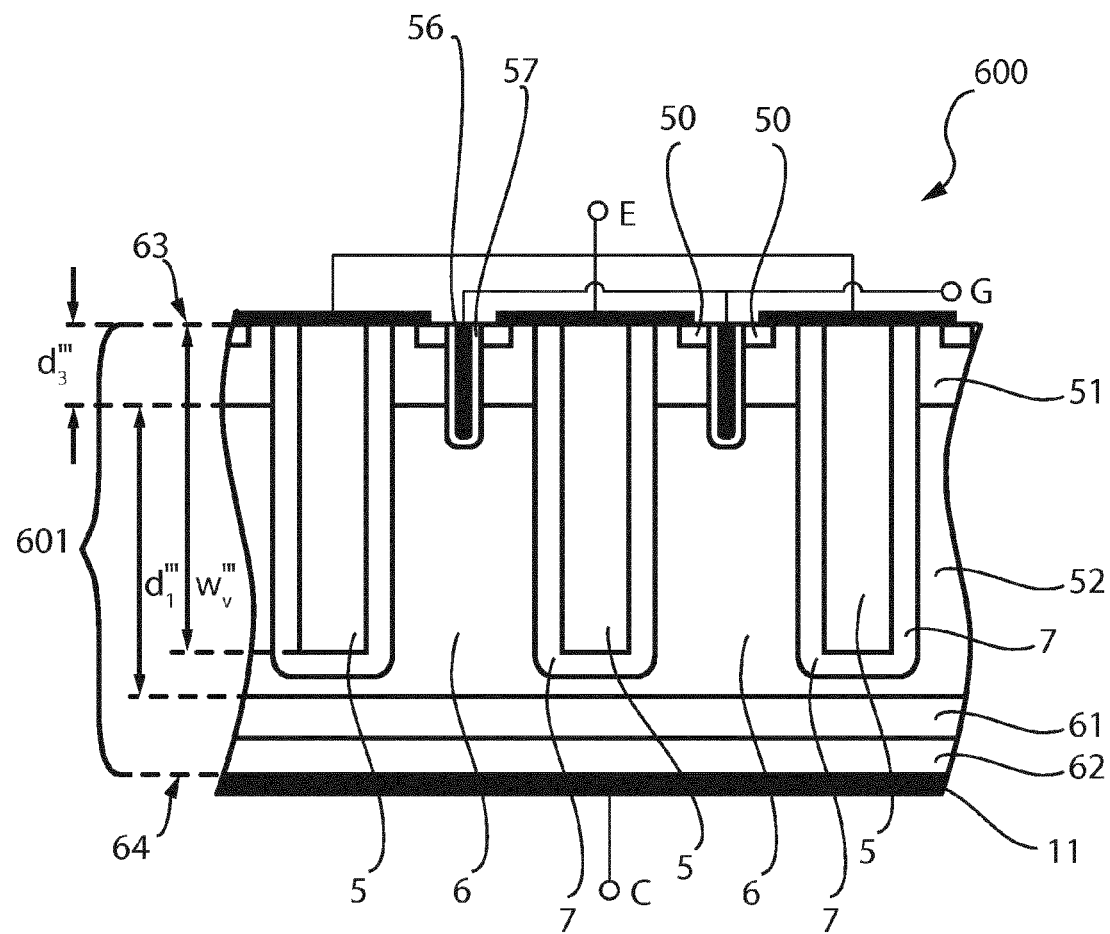
FIG. 6 shows a partial cross sectional view of a power semiconductor device according to a fifth embodiment of the invention.

In FIG. 6 there is shown a power semiconductor device according to a fifth embodiment. Due to the many similarities between the fifth embodiment and the fourth embodiment discussed above only the differences of the fifth embodiment to the fourth embodiment discussed above will be described in the following. With regard to the remaining features it is referred to the discussion of the fourth embodiment and to the discussion of the first embodiment, to which it is referred in the discussion of the fourth embodiment above. Elements in FIG. 6 which are indicated with the same reference signs as elements in the first and fourth embodiment have the same properties and characteristics as discussed above. A discussion of such elements may not be repeated. The power semiconductor device according to the fifth embodiment is a SJ trench insulated gate bipolar transistor (IGBT) 600 comprising a semiconductor wafer 601 having a first main side surface 63 and a second main side surface 64 opposite to the first main side surface 63. The SJ trench IGBT 600 according to the fifth embodiment differs from the SJ trench MOSFET 500 in that it comprises, in an order from the first main side surface 63 to the second main side surface 64, an $n^+$-type buffer layer 61 and a p-type collector layer 62 (which is the second semiconductor layer in the claims) on the backside of the device instead of the substrate layer 9. As a further difference to the fourth embodiment, the SJ trench IGBT 600 has an emitter terminal E instead of a source terminal S, and has a collector terminal C instead of a drain terminal D. A trench IGBT cell, which is formed between each pair of two neighbouring first semiconductor regions 5 is a fifth example of a power device cell.

In the description above, specific embodiments were described. However, alternatives and modifications of the above described embodiments are possible.

In the above embodiments the power semiconductor device was described with a second semiconductor region 7 separating the first semiconductor regions 5 from the drift layer 2, 32, 42, 52, 62, respectively. However, the second semiconductor region 7 is optional and the first semiconductor regions 5 may be in direct contact with the drift layer 2, 32, 42, 52, 62, n-type layer 30, source layer 40, channel layer 41, source layer 51, base layer 52, buffer layer 61, and collector layer 62, respectively. Accordingly, also the annealing step in which the second semiconductor region 7 is formed is optional and may be omitted.

In all figures the first semiconductor region 5 and the second semiconductor region 7 extend from the upper side of the drift layer 2, 32, 42, 52, 62 to a depth, which is less than the layer thickness of the drift layer 2, 32, 42, 52, 62, respectively. That means that in the first to fourth embodiment, the first semiconductor region 5 and the second semiconductor region 7 are separated from the substrate layer 9. However, the first semiconductor regions 5 and/or the second semiconductor regions 7 may extend to or into the substrate layer 9. Likewise, while in the fifth embodiment the first semiconductor region 5 and the second semiconductor region 7 do not reach the buffer layer, they may extend to or into the buffer layer.

In a modified first embodiment the first semiconductor regions 5 and the second semiconductor regions 7 may extend also into the anode layer 8, or may alternatively be separated from the anode layer by a portion of the drift layer 2.

In the second to fourth embodiment the first semiconductor region 5 and the second semiconductor region 7 extend from the first main side surface 33, 43, 53, 63 of the semiconductor wafer 301, 401, 501, 601, respectively. However, the first semiconductor region 5 and/or the second semiconductor region 7 may also be separated from the first main side surface 33, 43, 53, 63.

The above embodiments were explained with specific conductivity types. The conductivity types of the semiconductor layers in the above described embodiments might be switched, so that in a specific embodiment all layers which were described as p-type layers would be n-type layers and all layers which were described as n-type layers would be p-type layers. For example, in a modified first embodiment, the drift layer 2 may be a p-type layer, the anode layer 8 may be a n-type layer, and the substrate layer 9 may be a p$^+$-type layer.

In the first to fourth embodiment the SJ drift layer including the first semiconductor regions 5 of cubic SIC was discussed for SJ power diode 100, SJ trench JBS rectifier 300, SJ trench JFET 400, SJ trench MOSFET 500 and SJ trench IGBT 600. However, the power semiconductor device of the invention may be any other vertical power semiconductor device having a SJ drift layer structure. The IGBT 600 was described with buffer layer 61. However, the buffer layer is optional and a power semiconductor device according to the invention may be an IGBT without buffer layer 61.

It should be noted that the term "comprising" does not exclude other elements or steps and that the indefinite article "a" or "an" does not exclude the plural. Also elements described in association with different embodiments may be combined.

LIST OF REFERENCE SIGNS 2, 32, 42, 52 (n$^-$-type) drift layer (first semiconductor layer)
3, 33, 43, 53, 63 first main side surface
4, 34, 44, 54, 64 second main side surface
5 first semiconductor region
6 portion of the n$^-$-type drift layer
7 (p-type) second semiconductor region
8 (p$^+$-type) anode layer
9 (n$^+$-type) substrate layer (second semiconductor layer)
10 first electrode layer
11 second electrode layer
30 n-type layer
40 (n$^+$-type) source layer
41 (n-type) channel layer
50 (n$^+$-type) source layer
51 (p-type) base layer
56 trench gate electrode
61 (n$^+$-type) buffer layer
62 (p-type) collector layer
100 SJ power diode
101, 301, 401, 501, 601 semiconductor wafer
300 SJ trench JBS rectifier
400 SJ trench JFET
500 SJ trench MOSFET
600 SJ trench IGBT
A anode terminal
C collector terminal
D drain terminal
K cathode terminal
E emitter terminal
S source terminal
G gate terminal
$d_1$ layer thickness of the drift layer
$d_2$ distance between each pair of neighbouring first semiconductor regions
$d_3$ thickness of the anode layer 8
$d_3'$ thickness of the n-type layer 30
$d_3''$ total thickness of the source layer 40 and the channel layer 41
$d_3'''$ thickness of the base layer 51
$w_H$ horizontal width of the first semiconductor region
$w_v$, $w_v'$, $w_v''$, $w_v'''$ vertical width of the first semiconductor region

The invention claimed is:

1. A superjunction power semiconductor device comprising:
 a semiconductor wafer having a first main side surface and a second main side surface, the semiconductor wafer including:
  a first semiconductor layer having a first conductivity type;
  a plurality of columnar or plate-shaped first semiconductor regions extending in the first semiconductor layer between the first main side surface and the second main side surface in a vertical direction perpendicular to the first main side surface and the second main side surface, the first semiconductor regions having a second conductivity type, which is different from the first conductivity type, wherein the first semiconductor layer is a layer of hexagonal silicon carbide, and wherein the first semiconductor regions are regions of 3C polytype cubic silicon carbide; and
  a second semiconductor region of hexagonal silicon carbide separating the first semiconductor layer from the first semiconductor regions, wherein the second semiconductor region is of the second conductivity type.

2. The superjunction power semiconductor device according to claim 1, wherein the first semiconductor layer is a drift layer having a thickness in a vertical direction of at least 3 μm and having a doping concentration below $2 \cdot 10^{17}$ cm$^{-3}$.

3. The superjunction power semiconductor device according to claim 2, wherein the 3C polytype cubic silicon carbide is polycrystalline.

4. The superjunction power semiconductor device according to claim 1, wherein the 3C polytype cubic silicon carbide is polycrystalline.

5. The superjunction power semiconductor device according to claim 4, wherein the first semiconductor layer is single crystalline.

6. The superjunction power semiconductor device according to claim 1, wherein the first semiconductor layer is a single crystalline.

7. The superjunction power semiconductor device according to claim 1, wherein the hexagonal silicon carbide is 4H—SiC or 6H—SiC.

8. The superjunction power semiconductor device according to claim 1, the semiconductor wafer comprising a second semiconductor layer on the first semiconductor layer and an electrode layer formed on the second semiconductor layer on a side opposite to the first semiconductor layer to form an ohmic contact to the second semiconductor layer, wherein the second semiconductor layer has a doping concentration which is at least 10 times as high as the doping concentration in the first semiconductor layer.

9. The superjunction power semiconductor device according to claim 1, wherein each pair of first semiconductor regions neighboring to each other in a horizontal direction parallel to the first main side surface and the second main side surface are separated from each other in the horizontal direction by a portion of the first semiconductor layer so that the first semiconductor regions alternate with the portions of the first semiconductor layer in the horizontal direction.

10. The superjunction power semiconductor device according to claim 9, wherein for each first semiconductor region a vertical of the first semiconductor region in a vertical direction perpendicular to the first main side surface and the second main side surface is at least two times a horizontal width of the first semiconductor region in the horizontal direction, wherein a vertical width of any first semiconductor region is a maximum width of that first semiconductor region in the vertical direction and wherein a horizontal width of any first semiconductor region is a maximum width of that first semiconductor region in the horizontal direction.

11. The superjunction power semiconductor device according to claim 10, wherein a vertical width of each first semiconductor region is at least 3 µm.

12. The superjunction power semiconductor device according to claim 9, wherein a distance between each pair of neighboring first semiconductor regions is in a range from 2 µm to 20 µm.

13. The superjunction power semiconductor device according to claim 10, wherein a vertical width of each first semiconductor region is at least 4 µm.

14. The superjunction power semiconductor device according to claim 1, wherein each first semiconductor region extends into the first semiconductor layer in the vertical direction to a depth of at least 3 µm, from a first main side of the first semiconductor layer facing the first main side surface of the semiconductor wafer.

15. A method for manufacturing a superjunction power semiconductor device, the method comprising:
   including a semiconductor wafer having a first main side surface and a second main side surface;
   forming a first semiconductor layer in the semiconductor wafer, the first semiconductor layer having a first conductivity type, wherein the first semiconductor layer is a layer of hexagonal silicon carbide;
   forming a plurality of columnar or plate-shaped first semiconductor regions in the first semiconductor layer, wherein the plurality of columnar or plate-shaped first semiconductor regions extend between the first main side surface and the second main side surface in a vertical direction perpendicular to the first main side surface and the second main side surface, wherein the first semiconductor regions having a second conductivity type different from the first conductivity type, wherein the first semiconductor regions are separated from the first semiconductor layer by a second semiconductor region of hexagonal silicon carbide having the second conductivity type, and wherein the first semiconductor regions are regions of 3C polytype cubic silicon carbide;
   forming the first semiconductor layer as a layer of hexagonal silicon carbide, wherein the first semiconductor layer has a first main side and a second main side opposite to the first main side;
   forming a plurality of trenches in the first semiconductor layer from its first main side; and
   refilling the trenches with a layer of cubic silicon carbide having second conductivity type different from the first conductivity type to form the first semiconductor regions as columnar or plate-shaped regions of 3C polytype cubic silicon carbide, which extend from the first main side into the first semiconductor layer.

16. The method according to claim 15, the method further comprising a step of forming a power device cell at the first main side of the first semiconductor layer in an area between two of the first semiconductor regions neighboring to each other in a horizontal direction parallel to the first main side and the second main side.

17. The method according to claim 16, wherein refilling the trenches with the layer of cubic silicon carbide is done by chemical vapor deposition at a temperature below 1100° C.

18. The method according to claim 15, wherein refilling the trenches with the layer of 3C polytype cubic silicon is done by chemical vapor deposition at a temperature below 1100° C.

19. A superjunction power semiconductor device comprising:
   a first semiconductor layer comprising hexagonal silicon carbide having a first conductivity type;
   a first semiconductor region comprising 3C polytype cubic silicon carbide arranged in the first semiconductor region, the first semiconductor region having a second conductivity type different from the first conductivity type; and
   a second semiconductor region comprising hexagonal silicon carbide surrounding the first semiconductor region, the second semiconductor region having the second conductivity type.

20. The superjunction power semiconductor device of claim 19, further comprising:
   a third semiconductor region comprising 3C polytype cubic silicon carbide arranged in the first semiconductor region, the third semiconductor region having the second conductivity type different from the first conductivity type, wherein the third semiconductor region is separated from the first semiconductor region in a horizontal direction by a portion of the first semiconductor layer; and
   a fourth semiconductor region comprising hexagonal silicon carbide surrounding the third semiconductor region, the fourth semiconductor region having the second conductivity type.

* * * * *